(12) United States Patent
Murasawa

(10) Patent No.: US 7,053,295 B2
(45) Date of Patent: May 30, 2006

(54) ELECTRONIC DEVICE, INFORMATION PROCESSOR, AND ELECTROMAGNETIC RADIATION SUPPRESSING MEMBER

(75) Inventor: Osamu Murasawa, Tokyo (JP)

(73) Assignee: Sony Computer Entertainment, Inc., Tokyo (JP)

( * ) Notice: Subject to any disclaimer, the term of this patent is extended or adjusted under 35 U.S.C. 154(b) by 0 days.

(21) Appl. No.: 10/860,797

(22) Filed: Jun. 3, 2004

(65) Prior Publication Data

US 2004/0257786 A1 Dec. 23, 2004

(30) Foreign Application Priority Data

Jun. 5, 2003 (JP) .............................. 2003-160971

(51) Int. Cl.
 *H05K 9/00* (2006.01)
(52) U.S. Cl. .............................. 174/35 GC; 174/35 R; 361/719; 361/816
(58) Field of Classification Search .............. 174/35 R, 174/35 GC; 361/816, 818, 800, 719
See application file for complete search history.

(56) References Cited

U.S. PATENT DOCUMENTS

| 5,371,404 A | 12/1994 | Juskey et al. |
| 5,796,170 A | 8/1998 | Marcantonio |
| 6,144,557 A * | 11/2000 | Chen et al. .................. 361/704 |
| 6,205,026 B1 | 3/2001 | Wong et al. |
| 6,430,043 B1 | 8/2002 | Osburn |

FOREIGN PATENT DOCUMENTS

EP 1 300 884 9/2002

* cited by examiner

*Primary Examiner*—Hung V. Ngo
(74) *Attorney, Agent, or Firm*—Katten Muchin Rosenman LLP

(57) ABSTRACT

An electronic device (1) has an information processor (3) including a circuit board (31) and an integrated circuit element (32). The integrated circuit element is mounted on the circuit board for controlling input and output of information. Further, the circuit board is provided with a cover member (33A) having thermal conductivity and electrical conductivity and covering the integrated circuit element. The cover member, which is electrically connected to ground patterns (G) formed on the circuit board, includes an electromagnetic radiation suppressor (5) for suppressing radiation of electromagnetic waves generated from the integrated circuit element.

10 Claims, 8 Drawing Sheets

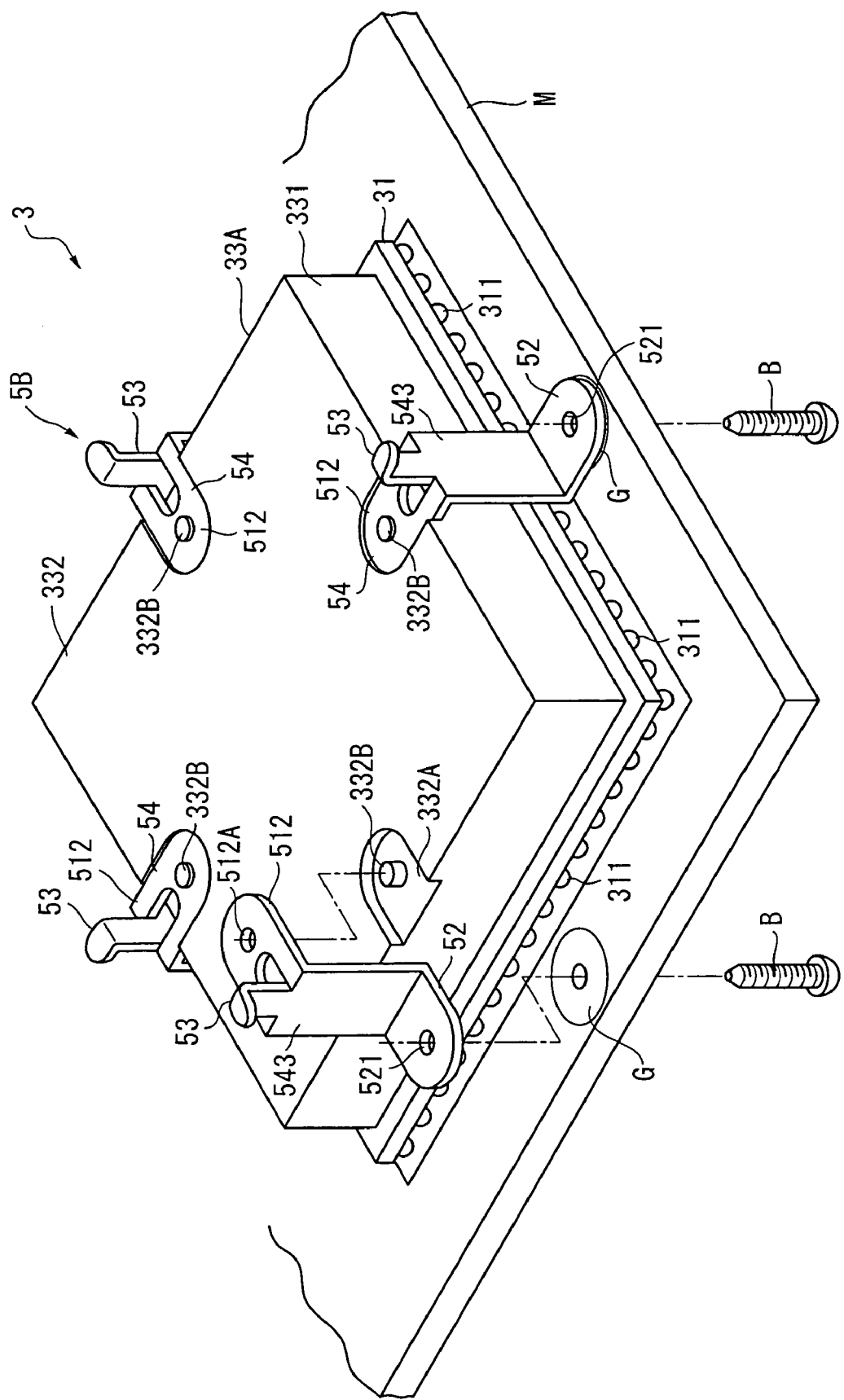

ELECTRONIC DEVICE, INFORMATION PROCESSOR, AND ELECTROMAGNETIC RADIATION SUPPRESSING MEMBER

BACKGROUND OF THE INVENTION

1. Field of the Invention

The present invention relates to an electronic device, an information processor, and an electromagnetic radiation suppressing member.

2. Description of Related Art

Conventionally, in an electronic device such as a personal computer or an entertainment device, an information processor such as a CPU (Central Processing Unit) provided with an integrated circuit element is mounted on a circuit board (mother board etc.). Such information processor such as a CPU includes a circuit board, an integrated circuit element mounted on the circuit board, and a cover member having thermal conductivity that covers the integrated circuit element. This cover member having thermal conductivity releases heat generated due to processing in the CPU or the like.

Recently, such an information processor is required to process information at high speed. On the other hand, if an information processor such as a CPU processes information at higher speed, stronger electromagnetic waves are generated from an integrated circuit element mounted on a circuit board, bonding wires connecting the integrated circuit element and the circuit board, and patterns on the circuit board or the like.

Since the cover member is insulated from the mother board, the cover member undesirably receives electromagnetic waves radiated from the integrated circuit element etc. mounted on the circuit board of electronic parts, and reradiates the electromagnetic waves. Thus reradiated electromagnetic waves may be superposed by a heat-conducting member such as a heat sink arranged on the cover member, and undesirably radiated to the outside of the information processor.

Accordingly, the present invention has an object to overcome the above-mentioned drawbacks by providing an electronic device, an information processor, and an electromagnetic radiation suppressing member that can suppress radiation of electromagnetic waves from an information processor.

SUMMARY OF THE INVENTION

An object of the present invention is to provide an electronic device, an information processor, and an electromagnetic radiation suppressing member capable of suppressing radiation of electromagnetic waves from an information processor.

An electronic device according to one aspect of the present invention includes an information processor having an integrated circuit element for processing input information and a cover member having thermal conductivity and electrical conductivity that covers the integrated circuit element, and a circuit board for controlling input and output of information that the information processor mounted thereon, in which the electronic device includes an electromagnetic radiation suppressor electrically connecting ground patterns formed on the circuit board and the cover member to suppress radiation of electromagnetic waves generated from the integrated circuit element.

The electronic device may be a personal computer, an entertainment device, a mobile phone, a home electric appliance such as a refrigerator or a washing machine, etc.

The electromagnetic radiation suppressor may be formed integrally with the cover member, or may be independent of the cover member.

The electromagnetic radiation suppressor may directly abut on the ground patterns and on the cover member to electrically connect the ground patterns and the cover member, or may indirectly abut on the ground patterns and on the cover member to electrically connect the ground patterns and the cover member.

According to the present invention, the electromagnetic radiation suppressor connects the ground patterns formed on the circuit board and the cover member of the information processor. Thus, when the cover member receives electromagnetic waves radiated from the integrated circuit element or the like of the information processor, the electromagnetic waves can be transmitted to the ground patterns formed on the circuit board through the electromagnetic radiation suppressor. So, reradiation of the electromagnetic waves by the cover member can be suppressed, which can prevent radiation of electromagnetic waves from the information processor.

In the electronic device of the present invention, it is desirable that the electromagnetic radiation suppressor has an electromagnetic radiation suppressing member abutting on the ground patterns and on the cover member.

Since the cover member is independent of the electromagnetic radiation suppressing member of the electromagnetic radiation suppressor, in case the electromagnetic radiation suppressing member is not required, for example, in case power of electromagnetic waves generated from the integrated circuit element is low and radiation of electromagnetic waves can be suppressed using a shielded plate etc. alone, the electromagnetic radiation suppressing member can be dismounted.

In the electronic device of the present invention, it is desirable that the electromagnetic radiation suppressing member has a frame that encloses the sides of the cover member and has cover member abutments abutting on the cover member, and circuit board abutments that project outward from the frame and abut on the ground patterns formed on the circuit board.

Having the frame that has an opening inside and encloses the sides of the cover member, the electromagnetic radiation suppressing member can expose the top surface of the cover member. So, heat generated from the integrated circuit element can be released through the cover member, and lowering of heat-release efficiency of the information processor can be prevented.

In the electronic device of the present invention, the electromagnetic radiation suppressing member may have at least one connection piece that has a circuit board abutment abutting on the ground patterns formed on the circuit board, a cover member abutment abutting on the cover member, and a link section for linking the circuit board abutment and the cover member abutment.

Since the electromagnetic radiation suppressing member has at least one connection piece, area of part of the cover member that is enclosed by the electromagnetic radiation suppressing member can be reduced, and lowering of heat-release efficiency can be prevented.

In the electronic device of the present invention, it is desirable that the circuit board abutments abut on at least ground patterns of low impedance among the ground patterns arranged at the periphery of the position for mounting the information processor.

The circuit board abutments abut on at least ground patterns of low impedance among the ground patterns arranged at the periphery of the position for mounting the information processor, or abut on ground patterns of impedance below average among the ground patterns arranged at the periphery of the position for mounting the information processor.

According to the present invention, since the circuit board abutments abut on ground patterns of low impedance, electromagnetic waves can be efficiently transmitted to the ground patterns, which can surely suppress radiation of electromagnetic waves. So, many abutment points where the circuit board abutments abut on the ground patterns are not required to be formed, and the number of the circuit board abutments can be reduced. For example, in case the electromagnetic radiation suppressing member has connection pieces, radiation of electromagnetic waves can be suppressed by using only one connection piece, which can reduce the number of parts.

In the electronic device of the present invention, it is desirable that the cover member has depressions at which the cover member abutments of the electromagnetic radiation suppressing member are arranged.

According to the present invention, since the depressions are formed at the cover member, the position on the cover member for mounting the electromagnetic radiation suppressing member can be easily determined.

In the electronic device of the present invention, it is desirable that a heat-releasing member having electrical conductivity and thermal conductivity is arranged on the cover member, and the electromagnetic radiation suppressor has heat-releasing member abutments abutting on the heat-releasing member.

The heat-releasing member may abut on the ground patterns or does not have to abut on the ground patterns.

Since the electromagnetic radiation suppressor has heat-releasing member abutments abutting on the heat-releasing member, the electromagnetic radiation suppressor and the heat-releasing member are electrically connected.

In case the heat-releasing member does not abut on the ground patterns, when electromagnetic waves are reradiated from the cover member and the heat-releasing member receives the electromagnetic waves, the electromagnetic waves can be transmitted to the ground patterns formed on the circuit board through the electromagnetic radiation suppressor, which can surely suppress radiation of electromagnetic waves.

In case the heat-releasing member abuts on the ground patterns, electromagnetic waves reradiated from the cover member can be directly transmitted from the heat-releasing member to the ground patterns. Furthermore, in case the heat-releasing member abuts on the ground patterns, the electromagnetic radiation suppressor may indirectly abut on the ground patterns through the heat releasing member. Thus, electromagnetic waves received by the cover member can be transmitted from the electromagnetic radiation suppressor to the ground patterns through the heat-releasing member.

Above-described invention can be employed not only in an electronic device but also in an information processor having the electromagnetic radiation suppressor, and advantageous effects attained in an information processor are substantially similar to those attained in an electronic device.

That is, an information processor according to the present invention has an integrated circuit element for processing input information and a cover member having thermal conductivity and electrical conductivity that covers the integrated circuit element, the information processor being mounted on a circuit board, in which the information processor includes an electromagnetic radiation suppressor electrically connecting ground patterns formed on the circuit board and the cover member to suppress radiation of electromagnetic waves generated from the integrated circuit element.

The information processor may be a CPU, a chip set, a video chip, etc.

In the information processor of the present invention, it is desirable that the electromagnetic radiation suppressor has an electromagnetic radiation suppressing member abutting on the ground patterns and on the cover member.

In the information processor of the present invention, it is desirable that the electromagnetic radiation suppressing member has a frame that encloses the sides of the cover member and has cover member abutments abutting on the cover member, and circuit board abutments that project outward from the frame and abut on the ground patterns formed on the circuit board.

In the information processor of the present invention, the electromagnetic radiation suppressing member may have at least one connection piece that has a circuit board abutment abutting on the ground patterns formed on the circuit board, a cover member abutment abutting on the cover member, and a link section for linking the circuit board abutment and the cover member abutment.

Furthermore, above-described invention can be employed not only in an information processor but also as an electromagnetic radiation suppressing member, and advantageous effects attained as an electromagnetic radiation suppressing member are substantially similar to those attained in an electronic device or an information processor having the electromagnetic radiation suppressing member.

That is, an electromagnetic radiation suppressing member of the present invention suppresses radiation of electromagnetic waves generated from an integrated circuit element of an information processor that has the integrated circuit element for processing input information and a cover member having thermal conductivity and electrical conductivity that covers the integrated circuit element, the information processor being mounted on a circuit board, the electromagnetic radiation suppressing member abutting on the ground patterns formed on the circuit board and on the cover member, and electrically connecting the ground patterns and the cover member.

It is desirable that the electromagnetic radiation suppressing member of the present invention has a frame that encloses the sides of the cover member and has cover member abutments abutting on the cover member, and circuit board abutments that project outward from the frame and abut on the ground patterns formed on the circuit board.

The electromagnetic radiation suppressing member of the present invention may have at least one connection piece that has a circuit board abutment abutting on the ground patterns formed on the circuit board, a cover member abutment abutting on the cover member, and a link section for linking the circuit board abutment and the cover member abutment.

BRIEF DESCRIPTION OF THE DRAWINGS

FIG. 8 shows an exploded perspective view of yet another alternative configuration of a CPU.

DETAILED DESCRIPTION OF PREFERRED EMBODIMENT(S)

1. First Embodiment

The first embodiment of the present invention will be described below with reference to the accompanying drawings.

[Configuration of Personal Computer 1]

Figure 1:
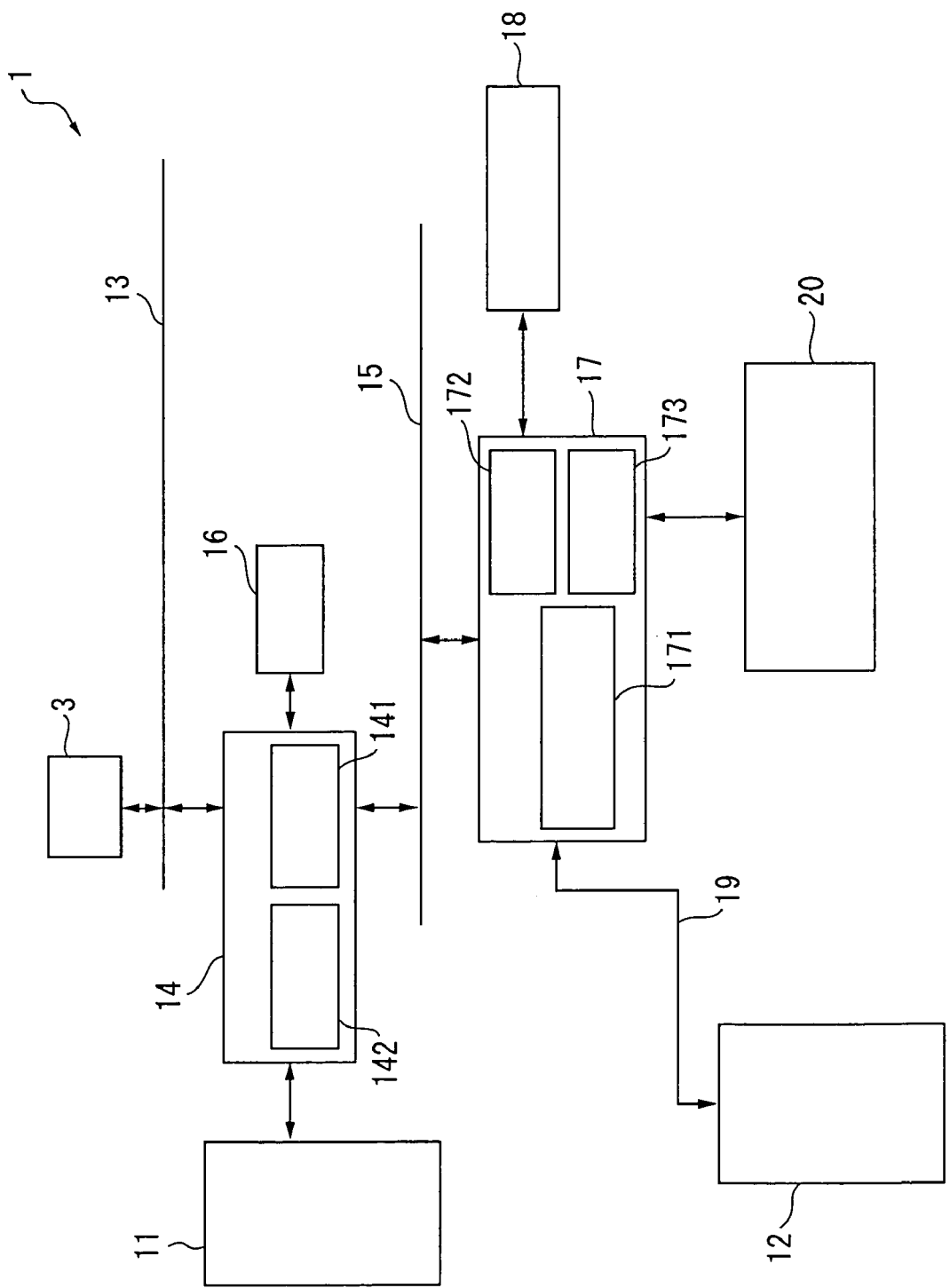
FIG. 1 shows a block diagram of a personal computer of a first embodiment according to the present invention.

FIG. 1 shows a block diagram of a personal computer 1, or an electronic device of the present invention.

The personal computer 1 includes a CPU 3 that is an information processor working as a central processing unit, a main memory 11 that is an internal storage device storing software information etc. to be executed by the CPU 3, an HDD (hard disc drive) 12 that is an external storage device, a north bridge 14, a cache memory 16, a south bridge 17, and a mother board M (refer to FIG. 2) having slots and connectors, not shown, for mounting these components.

The CPU 3 executes, or processes programs stored in the main memory 11 to control the whole personal computer 1. The configuration and details of the CPU 3 will be explained later. The CPU 3 has a primary cache memory, not shown, built therein, and the CPU 3 is connected to a host bus 13. The north bridge 14, which is connected to a PCI bus 15, is connected to the host bus 13.

The north bridge 14 has a host-PCI bridge 141 and a memory controller 142 and the like. The main memory 11 and the cache memory 16 are connected to the north bridge 14.

The host-PCI bridge 141 transfers data between the host bus 13 and the PCI bus 15, and the host-PCI bridge 141 enables transfer of data between the CPU 3 and a hard disc, not shown, connected to the PCI bus 15.

The memory controller 142 controls transfer of data between the main memory 11, the cache memory 16 and the CPU 3.

The main memory 11 may be a DRAM (Dynamic RAM) etc. that stores programs to be executed by the CPU 3 and data or the like to be processed in the programs. Data stored in the main memory 11 may be an OS program that controls basic operation of a computer, application programs, and so on.

The cache memory 16 stores commands, data, etc. that are often accessed by the CPU 3. The cache memory 16 stores data read out from the main memory 11 by the CPU 3, and provides the CPU 3 with the same data when required by the CPU 3.

The south bridge 17 is connected to the PCI bus 15 to which the north bridge 14 is connected.

The south bridge 17 has an IDE controller 171, a USB controller 172, a multi-I/O controller 173, etc.

The south bridge 17 and the north bridge 14 described above constitute a chip set.

The USB controller 172 is connected to a USB-compliant device 18 that is a mouse, a keyboard, etc. through a USB connector. The multi-I/O controller 173 is connected to a serial-interface-compliant device or parallel-interface-compliant device 20 such as a printer or a scanner through a serial connector or a parallel connector.

The IDE controller 171 has a primary IDE controller and a secondary IDE controller, not shown. The primary IDE controller is connected to the HDD 12 over an IDE bus 19. The secondary IDE controller is connected to a CD-ROM etc., not shown, over another IDE bus.

The HDD 12 stores programs and data such as an OS program that controls basic operation of a computer and application programs.

In thus configured personal computer 1, when activation is completed, programs and data stored and saved in the HDO 12 are read out and sent to the main memory 11 over the IDE bus 19, south bridge 17, PCI bus 15, and north bridge 14. Then, the programs and data thus read out and sent to the main memory 11 are retrieved, and commands are executed by the CPU 3. Resultant data after the execution is written to the main memory 11, and the data thus written to the main memory 11 is sent to and stored in the HDD 12 over the north bridge 14, PCI bus 15, south bridge 17, and the IDE bus 19.

[Configuration of CPU 3]

The CPU 3 used in the above-described personal computer 1 employs electromagnetic radiation suppressing configuration so as to suppress radiation of electromagnetic waves. The configuration of the CPU 3 will be explained in detail by referring to FIG. 2 and FIG. 3.

Figure 2:
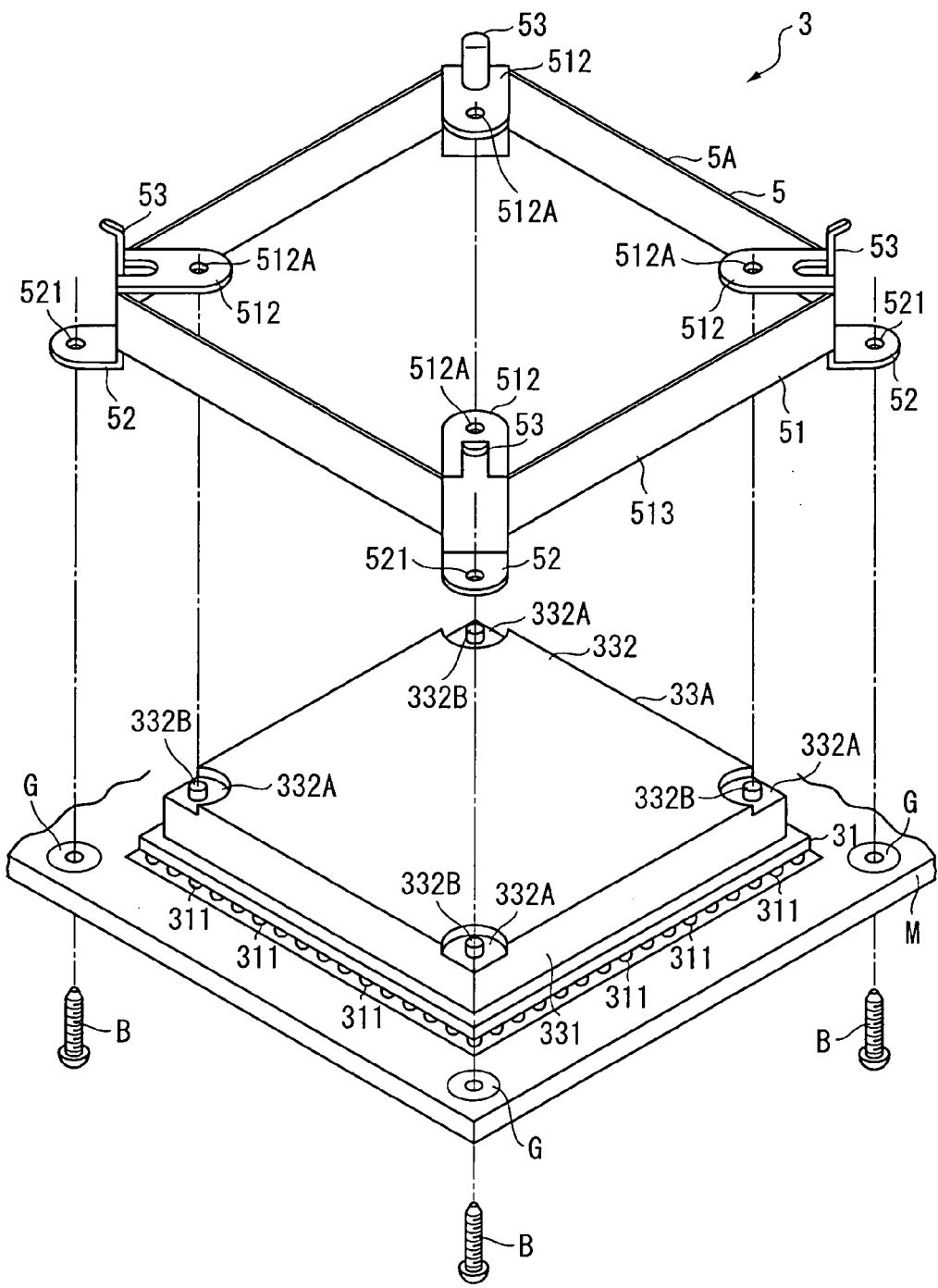
FIG. 2 shows an exploded perspective view of a CPU of the personal computer.
Figure 3:
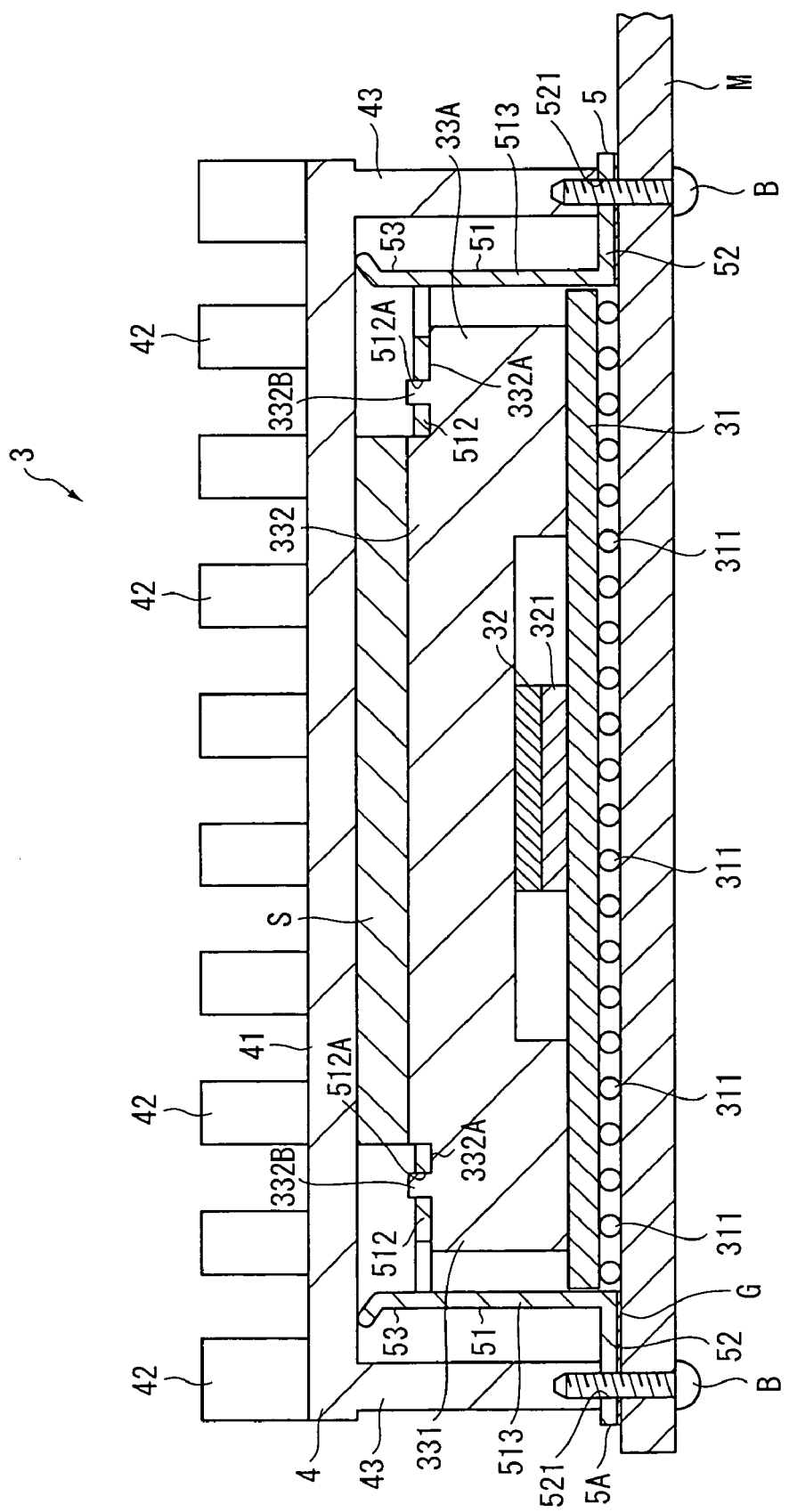
FIG. 3 shows a cross-sectional view of the CPU.

The CPU 3 is mounted on the mother board M, as shown in FIG. 2 and FIG. 3. On the mother board M, at the periphery of the position for mounting the CPU 3, there are formed four ground patterns G.

The CPU 3 has a CPU circuit board 31, an integrated circuit element 32 that is mounted on the CPU circuit board 31 and processes input information, a heat-diffusing board 33A working as a cover member that is arranged on the CPU circuit board 31 and covers the integrated circuit element 32, and an electromagnetic radiation suppressor 5.

One surface of the CPU circuit board 31, which is mounted to the mother board M, has solder balls 311 attached thereto, that is, the CPU 3 of the present embodiment is of the BGA (Ball Grid Array) configuration.

Furthermore, there is arranged silver paste 321 working as an adhesive layer between the CPU circuit board 31 and the integrated circuit element 32. The integrated circuit element 32 and the CPU circuit board 31 are electrically connected by bonding wires, not shown. The heat-diffusing board 33 -diffuses heat generated from the integrated circuit element 32 etc. The heat-diffusing board 33A has a substantially rectangular in plan view and has a box shape, and has its outside dimension made smaller than that of the CPU circuit board 31.

The heat-diffusing board 33A has a side member 331 that encloses the sides of the integrated circuit element 32, and a top member 332 that covers the top surface of the integrated circuit element 32 (the opposite side of a side facing the CPU circuit board 31). The top member 332 has depressions 332A, which are lowered toward the CPU circuit board 31 side, formed at the outer four corners thereof. The depressions 332A have projections 332B projecting toward the opposite side of the CPU circuit board 31 side.

The heat-diffusing board 33A is produced using material having thermal conductivity and electrical conductivity under injection molding or press molding. As material having thermal conductivity and electrical conductivity, metals such as copper, phosphor bronze may be used.

The electromagnetic radiation suppressor 5 has an electromagnetic radiation suppressing member 5A. The electromagnetic radiation suppressing member 5A abuts on the heat-diffusing board 33A as well as on the ground patterns G formed on the mother board M to electrically connect them for suppressing radiation of electromagnetic waves generated from the CPU 3. The electromagnetic radiation suppressing member 5A includes a frame 51 that has a substantially rectangular shape in plan view and encloses the sides of the heat-diffusing board 33A, and, for example, four circuit board abutments 52 projecting outward from the frame 51. The frame 51 and the circuit board abutments 52 of the electromagnetic radiation suppressing member 5A are formed integrally.

The frame 51 has a side member 513 in the form of a rectangular frame that encloses the side member 331 of the heat-diffusing board 33A and has its top side corresponding to the top member 332 of the heat-diffusing board 33A and its bottom side facing the mother board M being opened, and cover member abutments 512 arranged at and projecting toward the opening of the side member 513 from the four corners of the side member 513.

The cover member abutments 512 are arranged at the depressions 332A of the heat-diffusing board 33A to abut on the heat-diffusing board 33A. The cover member abutments 512 have openings 512A into which the projections 332B formed at the depressions 332A are inserted. When the projections 332B are inserted into the openings 512A, the cover member abutments 512 are fixed to the depressions 332A. When the cover member abutments 512 are fixed to the depressions 332A of the heat-diffusing board 33A, cover member abutments 512 does not project out of the top member 332 of the heat-diffusing board 33A, and the height of the top surface of the cover member abutments 512 is substantially equal to that of the top member 332.

At the boundary line between the cover member abutments 512 and the side member 513, there are formed heat-releasing member abutments 53 that extend to the opposite side of the side member 513 and abut on a heat sink (heat-releasing member) 4 to be explained later. The heat-releasing member abutments 53 are spring pieces that have their parts abutting on the heat sink 4 bent outward from the side member 513.

On the other hand, the circuit board abutments 52 are arranged at and projecting outward from the four corners of the side member 513. The circuit board abutments 52 abut on the four ground patterns G formed on the mother board M, and are fixed to the mother board M. The circuit board abutments 52 have openings 521 into which fixing screws B are inserted.

The electromagnetic radiation suppressing member 5A produced using material having electrical conductivity and thermal conductivity, that is, metals such as copper, phosphor bronze under injection molding or press molding.

In the present embodiment, the electromagnetic radiation suppressing member 5A is produced using material having electrical conductivity and thermal conductivity. However, the electromagnetic radiation suppressing member may have only electrical conductivity, and is not required to have thermal conductivity.

Since the side member 513 of the frame 51 of the electromagnetic radiation suppressing member 5A has the opening inside, the top member 332 of the heat-diffusing board 33A is exposed, as shown in FIG. 3. On the top member 332, a heat-conducting sheet S whose outside dimension is substantially equal to that of the top member 332 is attached, and on the heat-conducting sheet S, the heat sink 4 working as a heat-releasing member is arranged.

The heat-conducting sheet S increases the thermal conductivity between the heat-diffusing board 33A and the heat sink 4. On the other hand, silicone grease or the like may be used instead of the heat-conducting sheet S.

The heat sink 4 has a flat plate 41 arranged on the heat-conducting sheet S, plural posts 42 arranged on and protruding from the top surface of the flat plate 41 (the opposite side of a side attached to the heat-conducting sheet S, and fixing posts 43 arranged on and protruding from the bottom surface of the flat plate 41 (the side attached to the heat-conducting sheet S).

The fixing posts 43 abut on the circuit board abutments 52 of the electromagnetic radiation suppressing member 5A, and are fixed to the mother board M together with the circuit board abutments 52 using the screws B.

The heat sink 4 is made of material having high thermal conductivity such as aluminum.

[Effect of the First Embodiment]

According to the present embodiment, the following advantageous effects can be attained.

(1-1) Since the electromagnetic radiation suppressing member 5A having electrical conductivity has the circuit board abutments 52 abutting on the ground patterns G formed on the mother board M and fixed to the mother board M, and the frame 51 having the cover member abutments 512 abutting on the heat-diffusing board 33A of the CPU 3, the ground patterns G formed on the mother board M and the heat-diffusing board 33A of the CPU 3 are electrically connected. Thus, when the heat-diffusing board 33A receives electromagnetic waves radiated from the integrated circuit element 32 on the CPU circuit board 31, bonding wires, etc., the electromagnetic waves can be transmitted to the ground patterns G formed on the mother board M through the electromagnetic radiation suppressing member 5A. So, reradiation of the electromagnetic waves of the heat-diffusing board 33A can be suppressed, which can prevent radiation of electromagnetic waves from the CPU 3.

(1-2) Since the electromagnetic radiation suppressing member 5A is independent of the heat-diffusing board 33A, in case the electromagnetic radiation suppressing member 5A is not required, for example, in case power of electromagnetic waves generated from the CPU 3 is low and radiation of electromagnetic waves can be suppressed using a shielded plate etc. alone, the electromagnetic radiation suppressing member 5A can be dismounted. So, the production cost of the personal computer 1 as an electronic device can be reduced.

(1-3) The electromagnetic radiation suppressing member 5A has the frame 51 having the side member 513 enclosing the side member 331 of the heat-diffusing board 33A and the cover member abutments 512 arranged at the depressions 332A of the heat-diffusing board 33A, and the top member 332 of the heat-diffusing board 33A can be exposed since the frame 51 is provided with the side member 513 having an opening inside. That is, since the top member 332 of the heat-diffusing board 33A is scarcely covered by the electromagnetic radiation suppressing member 5, heat generated from the integrated circuit element 32 can be released from the top member 332 of the heat-diffusing board 33A. So, lowering of heat-release efficiency of the CPU 3 can be prevented.

Furthermore, since the electromagnetic radiation suppressing member 5A is made of material having thermal conductivity, heat conducted to the depressions 332A of the heat-diffusing board 33A can be released through the electromagnetic radiation suppressing member 5A. So, lowering of heat-release efficiency of parts of the heat-diffusing board 33A with which the electromagnetic radiation suppressing member 5A is in contact can be prevented.

(1-4) Since the heat-diffusing board 33A has the depressions 332A at which the cover member abutments 512 of the frame 51 of the electromagnetic radiation suppressing member 5A are arranged, and the depressions 332A have projections 332B that are inserted into the openings 512A of the cover member abutments 512, a position on the heat-diffusing board 33A for mounting the electromagnetic radiation suppressing member 5A can be easily determined.

(1-5) Since the heat-diffusing board 33A has the depressions 332A, even if the cover member abutments 512 of the frame 51 of the electromagnetic radiation suppressing member 5A are arranged on the heat-diffusing board 33A, the cover member abutments 512 does not project out of the top member 332 of the heat-diffusing board 33A toward the heat sink 4, which can reduce the thickness of the CPU 3.

(1-6) Since the frame 51 of the electromagnetic radiation suppressing member 5A has the cover member abutments 512 arranged on the depressions 332A of the heat-diffusing board 33A, when the electromagnetic radiation suppressing member 5A is mounted on the heat-diffusing board 33A, the heat-diffusing board 33A is pressed toward the mother board M by the cover member abutments 512. So the solder balls 311 of the CPU 3 are not released from the mother board M, and the CPU 3 can be surely mounted on the mother board M.

(1-7) The circuit board abutments 52 are arranged at the four corners of the frame 51 of the electromagnetic radiation suppressing member 5A, and the circuit board abutments 52 are fixed to the mother board M. Thus, the electromagnetic radiation suppressing member 5A is fixed to the mother board M diagonally, and the electromagnetic radiation suppressing member 5A can be surely fixed to the mother board M.

(1-8) The cover member abutments 512 of the electromagnetic radiation suppressing member 5A are arranged at the depressions 332A formed at the four corners of the top member 332 of the heat-diffusing board 33A. Thus, the heat-diffusing board 33A is fixed by the electromagnetic radiation suppressing member 5A diagonally, and the heat-diffusing board 33A can be surely fixed to the mother board M.

(1-9) The electromagnetic radiation suppressing member 5A has the frame 51 and the circuit board abutments 52 formed integrally, and is of one unit configuration, which can prevent increase of the number of parts. Being of one unit configuration, troublesome works are not required in attaching the electromagnetic radiation suppressing member 5A to the heat-diffusing board 33A and to the mother board M.

(1-10) Since the electromagnetic radiation suppressing member 5A has the heat-releasing member abutments 53 abutting on the heat sink 4, even if the heat sink 4 receives electromagnetic waves reradiated from the heat-diffusing board 33A, the electromagnetic waves can be transmitted to the ground patterns G formed on the mother board M through the electromagnetic radiation suppressing member 5A. Thus, radiation of electromagnetic waves can be surely prevented. Furthermore, since the fixing posts 43 of the heat sink 4 abut on the electromagnetic radiation suppressing member 5A, electromagnetic waves can also be transmitted to the electromagnetic radiation suppressing member 5A through the fixing posts 43 of the heat sink 4.

(1-11) Since the heat-releasing member abutments 53 of the electromagnetic radiation suppressing member 5A are spring pieces that have their parts abutting on the heat sink 4 bent outward, abutting area of the electromagnetic radiation suppressing member 5A that abuts on the heat sink 4 can be enlarged. So, electromagnetic waves can be surely transmitted from the heat sink 4 to the electromagnetic radiation suppressing member 5A.

(1-12) Since the heat-releasing member abutments 53 of the electromagnetic radiation suppressing member 5A are spring pieces, when fixing the heat sink 4 to the mother board M, force is applied to the heat-releasing member abutments 53 to induce repulsive force, and the electromagnetic radiation suppressing member 5A is pressed by the heat sink 4 and the mother board M. So, deviation of position on the mother board M for mounting the electromagnetic radiation suppressing member 5A can be surely prevented.

(1-13) In the present embodiment, the circuit board abutments 52 abut on all the four ground patterns G formed at the periphery of the CPU 3, electromagnetic waves can be surely transmitted to the ground patterns G.

2. Second Embodiment

Figure 4:
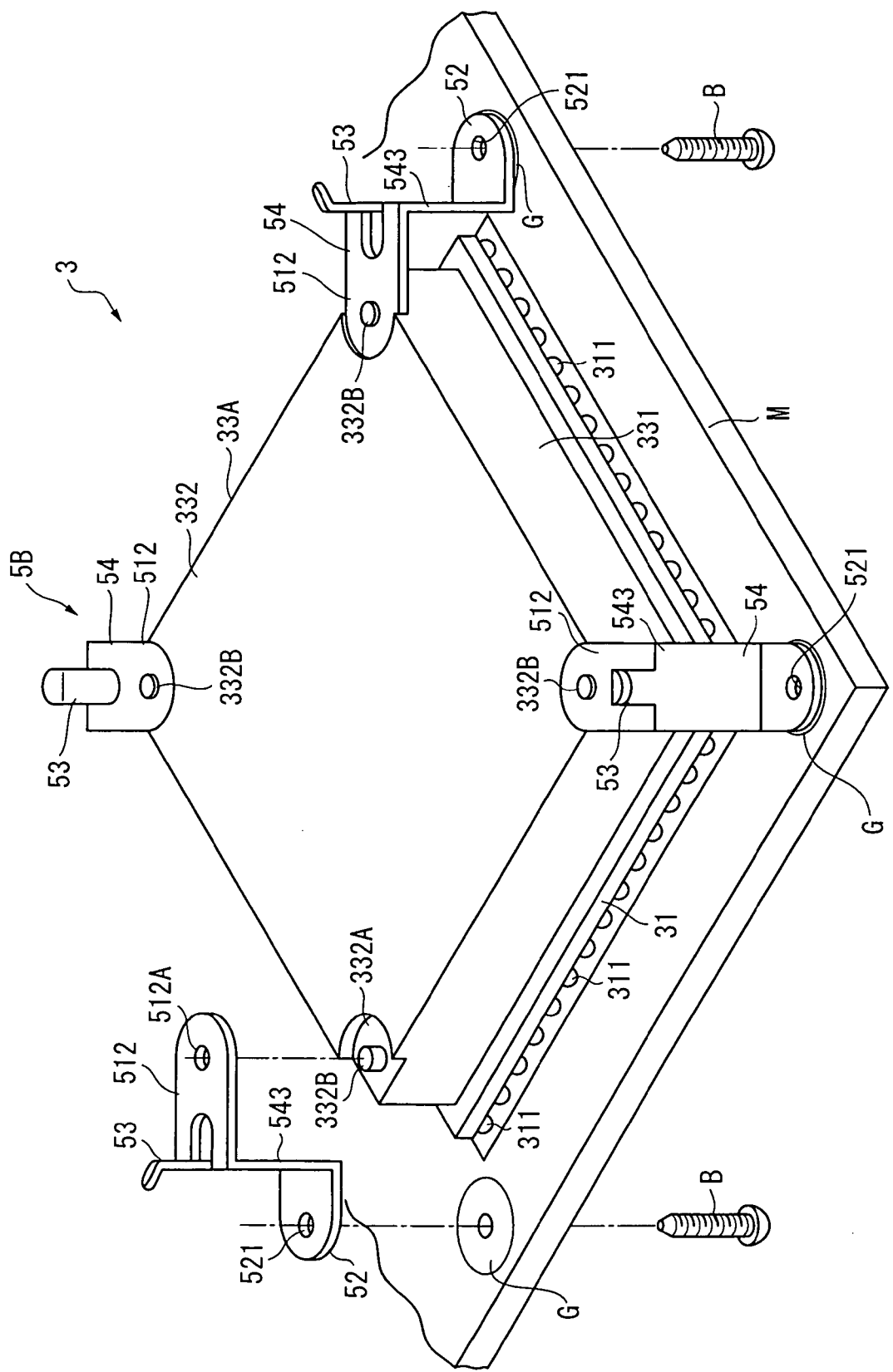
FIG. 4 shows an exploded perspective view of a CPU of a second embodiment according to the present invention.

Next, the second embodiment of the present invention will be described by referring to FIG. 4. In the following explanation, parts or components similar to those of the first embodiment are indicated with the same reference numerals, and detailed explanation of which will be omitted.

In the first embodiment, the electromagnetic radiation suppressing member 5A has the frame 51 and the circuit board abutments 52 formed integrally, and is of one unit configuration. On the other hand, the second embodiment employs electromagnetic radiation suppressing member 5B that is composed of plural members, for example, four independent connection pieces 54. Similar to the first embodiment, the electromagnetic radiation suppressing member 5B is produced using material having electrical conductivity and thermal conductivity.

Similar to the first embodiment, connection pieces 54 abut on both the mother board M and the heat-diffusing board 33A to connect them. The connection pieces 54 have circuit board abutments 52 abutting on and fixed to the mother board M, cover member abutments 512 abutting on the depressions 332A of the heat-diffusing board 33A, and link sections 543 for linking the circuit board abutments 52 and the cover member abutments 512. Accordingly, in the second embodiment, the heat-diffusing board 33A has its four corners alone, where the depressions 332A are formed, enclosed by the electromagnetic radiation suppressing member 5B.

Furthermore, similar to the first embodiment, at the boundary line between the cover member abutments 512 and the link sections 543, there are formed heat-releasing member abutments 53 abutting on the heat sink 4.

[Effect of the Second Embodiment]

According to the second embodiment, in addition to advantageous effects substantially similar to (1-1), (1-2), (1-4) to (1-6), (1-8), and (1-10) to (1-13) in the first embodiment, the following further advantageous effects can be attained.

(2-1) In the second embodiment, the electromagnetic radiation suppressing member 5B is composed of the four independent connection pieces 54 fixed to the depressions 332A formed at the four corners of the heat-diffusing board 33A, and the side member 331 of the heat-diffusing board 33A is scarcely enclosed by the electromagnetic radiation suppressing member 5B. So, heat-releasing area of the heat-diffusing board 33A can be enlarged, and lowering of heat-release efficiency can be surely prevented.

Furthermore, similar to the first embodiment, since the electromagnetic radiation suppressing member 5B is made of material having thermal conductivity, heat conducted to the depressions 332A of the heat-diffusing board 33A can be released through the electromagnetic radiation suppressing member 5B. So, lowering of heat-release efficiency of parts of the heat-diffusing board 33A with which the electromagnetic radiation suppressing member 5B is in contact can be prevented.

(2-2) Since the electromagnetic radiation suppressing member 5B has its connection pieces 54 fixed to the four corners of the top member 332 of the heat-diffusing board 33A, the connection pieces 54 can be easily fixed.

3. Third Embodiment

Figure 5:
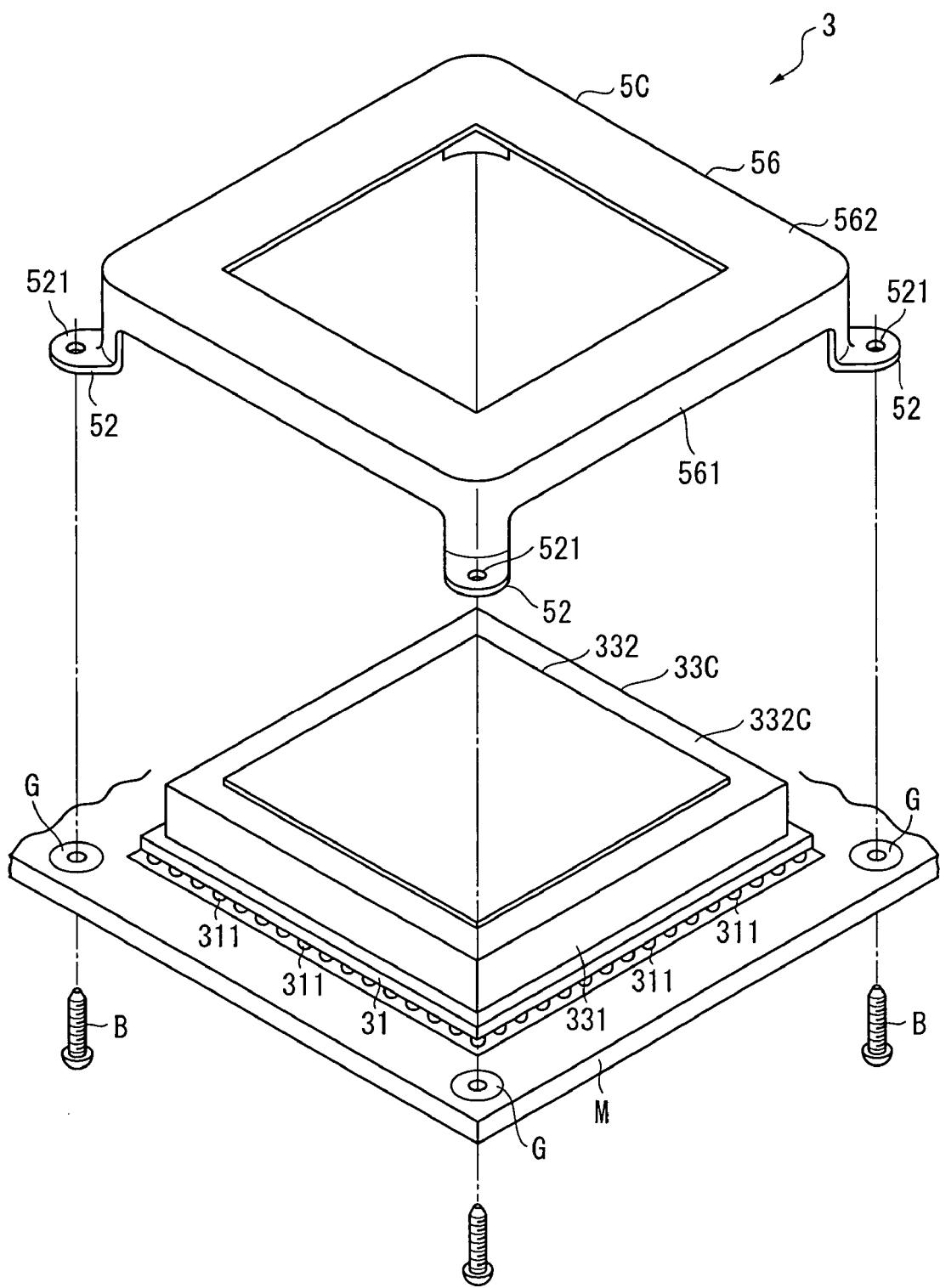
FIG. 5 shows an exploded perspective view of a CPU of a third embodiment according to the present invention.

Next, the third embodiment of the present invention will be described by referring to FIG. 5.

In the first embodiment and the second embodiment, the top member 332 of the heat-diffusing board 33A of the CPU 3 has the depressions 332A formed at only the outer four corners thereof. On the other hand, the third embodiment employs a heat-diffusing board 33C whose top member 332 has a depression 332C formed at the outer circumference thereof. The depression 332C does not have the projections 332B, as is different from the first and second embodiments.

Furthermore, an electromagnetic radiation suppressing member 5C of the third embodiment has a frame 56 of substantially rectangular shape in plan view that has an opening at its center and encloses the sides of the heat-diffusing board 33C, and, similar to the first embodiment, the circuit board abutments 52 projecting outward from the four corners of the frame 56. The frame 56 and the circuit board abutments 52 of the electromagnetic radiation suppressing member 5C are formed integrally. The electromagnetic radiation suppressing member 5C is made of the same material as that of the electromagnetic radiation suppressing member 5A of the first embodiment.

The frame 56 has its cross section made L-shaped, which has a side member 561 that encloses the side member 331 of the heat-diffusing board 33C, and a cover member abutment 562. The cover member abutment 562 is arranged at and abuts on the depression 332C.

When the electromagnetic radiation suppressing member 5C is arranged on the heat-diffusing board 33C, the height of the top surface of the cover member abutment 562 is substantially equal to that of the top member 332 of the heat-diffusing board 33C.

The opening of the frame 56 of the electromagnetic radiation suppressing member 5C exposes the top member 332 of the heat-diffusing board 33C. Similar to the foregoing embodiments, on the top member 332, the heat-conducting sheet S is attached, and on the heat-conducting sheet S, the heat sink 4 is arranged, which is not shown in FIG. 5. The fixing posts 43 of the heat sink 4 are fixed to the mother board M together with the circuit board abutments 52 using the screws B.

The electromagnetic radiation suppressing member 5C does not have the heat-releasing member abutments 53 abutting on the heat sink 4, as is different from the foregoing embodiments.

[Effect of the Third Embodiment]

According to the third embodiment, in addition to advantageous effects substantially similar to (1-1), (1-3), (1-5) to (1-7), (1-9), and (1-13) in the first embodiment, the following further advantageous effects can be attained.

(3-1) Since the heat-diffusing board 33C has the depression 332C, and the cover member abutment 562 of the electromagnetic radiation suppressing member 5C fits into the depression 332C, a position on the heat-diffusing board 33C for mounting the electromagnetic radiation suppressing member 5C can be easily determined.

(3-2) Since the electromagnetic radiation suppressing member 5C does not have the heat-releasing member abutments, the electromagnetic radiation suppressing member 5C can be easily produced as compared with the case in which the heat-releasing member abutments are arranged.

(3-3) Since the depression 332C of the heat-diffusing board 33C does not have projections, troublesome works of forming such projections can be removed.

(3-4) Since the opening of the frame 56 of the electromagnetic radiation suppressing member 5C exposes the top member 332 of the heat-diffusing board 33C, even if the electromagnetic radiation suppressing member 5C is arranged on the heat-diffusing board 33C, lowering of heat-release efficiency of the heat-diffusing board 33C can be prevented.

(3-5) Since the fixing posts 43 of the heat sink 4 are fixed to the mother board M together with the circuit board abutments 52 using the screws B, electromagnetic waves received by the heat sink 4 can be transmitted to the electromagnetic radiation suppressing member 5C through the fixing posts 43, which can suppress radiation of electromagnetic waves.

4. Alternative Configurations

The present invention is not limited to above-described embodiments, and various modifications, alternative configurations or equivalents, which achieve the object of the present invention, can be implemented.

For example, in the foregoing embodiments, the electromagnetic radiation suppressor 5 has the electromagnetic radiation suppressing members 5A, 5B and 5C which are independent of the heat-diffusing boards 33A, 33C. On the other hand, the electromagnetic radiation suppressor may be formed integrally with the cover member, or the heat-diffusing board. In this case, since the cover member and the electromagnetic radiation suppressor become of one unit configuration, the number of parts can be reduced, and an information processor can be easily set up.

In the foregoing embodiments, the heat-diffusing boards 33A, 33C have the depressions 332A, 332C on which the electromagnetic radiation suppressing members 5A, 5B and 5C abut. On the other hand, the depressions do not have to be formed. In this case, the process to form the depressions can be removed, and troublesome works can be reduced in producing the cover member.

In the foregoing embodiments, the electromagnetic radiation suppressing members 5A, 5B and 5C have four circuit board abutments 52. On the other hand, the number of the circuit board abutments 52 is not restricted to this, that is, when five or more ground patterns are formed at the periphery of the CPU 3, five or more circuit board abutments 52 may be formed.

On the other hand, the number of the circuit board abutments 52 my be less than four, that is, the circuit board abutments 52 may abut on ground patterns G of low impedance among the four ground patterns G, or abut on ground patterns G of impedance below average among the four ground patterns G. Even if the circuit board abutments 52 of the electromagnetic radiation suppressing member 5A abut on ground patterns G of low impedance, electromagnetic waves can be surely transmitted to the ground patterns G, which can suppress radiation of electromagnetic waves. So, the number of abutment points where the circuit board abutments 52 abut on the ground patterns G can be reduced, and many circuit board abutments 52 are not required to be formed.

In case transmission efficiency of electromagnetic waves between a ground pattern G of the lowest impedance of the four ground patterns G and the circuit board abutments 52 is favorable, one circuit board abutment 52 may be made to abut on the ground pattern G of the lowest impedance, that is, the electromagnetic radiation suppressing member 5B may have only one connection piece 54.

Figure 6:
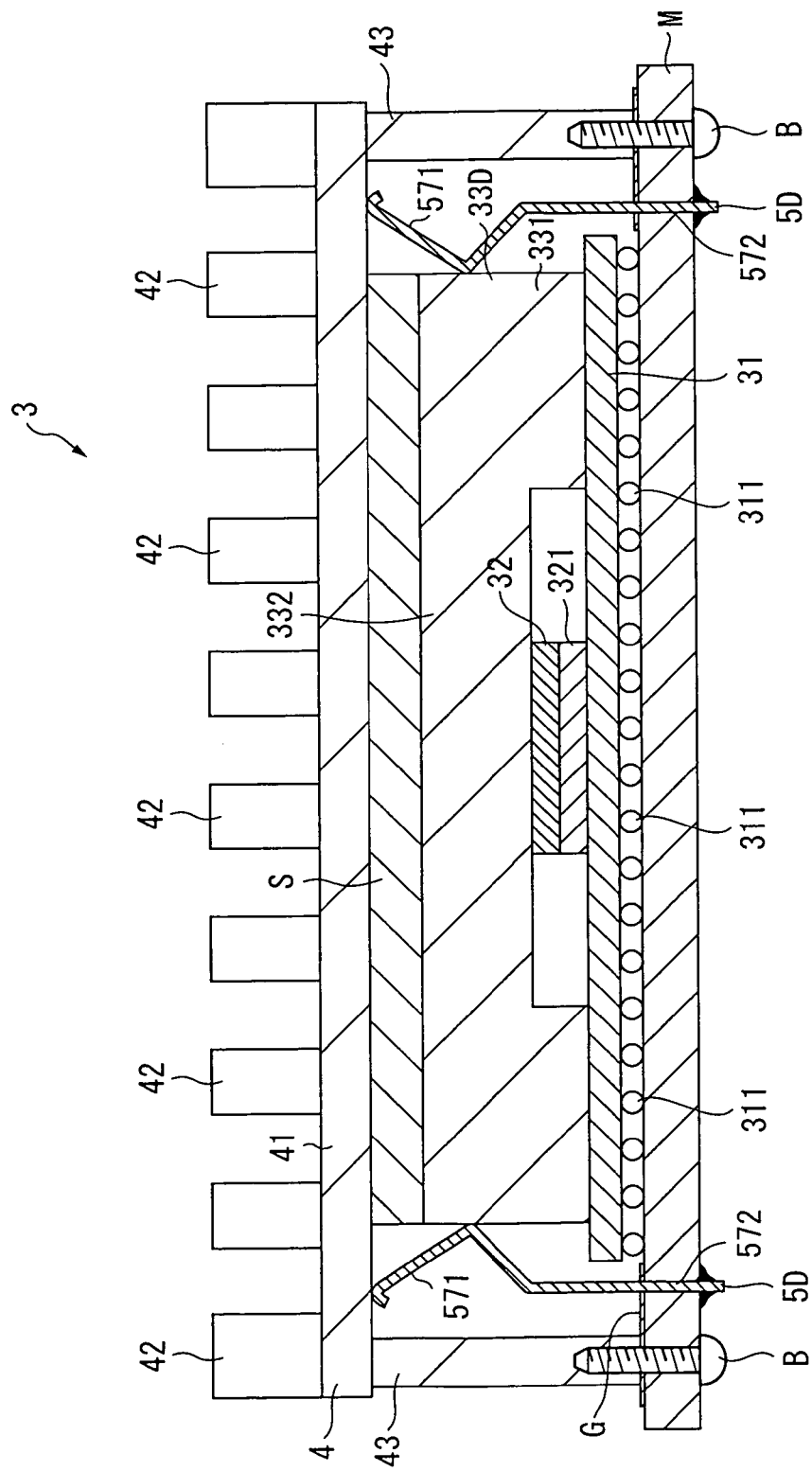
FIG. 6 shows a cross-sectional view of an alternative configuration of a CPU and an electromagnetic radiation suppressing member arranged in the CPU.

For example, in the foregoing embodiments, the electromagnetic radiation suppressing members 5A, 5B and 5C press the depressions 332A, 332C of the heat-diffusing boards 33A, 33C. On the other hand, other configurations may be employed so long as the cover member is connected to the ground patterns G formed on the mother board M. For example, the configuration shown in FIG. 6 may be employed, in which an electromagnetic radiation suppressing member 5D is arranged. The electromagnetic radiation suppressing member 5D has a first piece 571 that has its one end made to abut on or fit into the heat sink 4 and has its other end made to abut on the side member 331 of a heat-diffusing board 33D, and a second piece 572 that has its one end connected to the latter end of the first piece 571 and has its other end fixed to the ground patterns G formed on the mother board M. Since thus configured electromagnetic radiation suppressing member 5D abuts on both the heat-diffusing board 33D and the ground patterns G formed on the mother board M, electromagnetic waves received by the heat-diffusing board 33D can be transmitted to the ground patterns G formed on the mother board M. The heat-diffusing board 33D has no depression, as is different from the foregoing embodiments.

Figure 7:
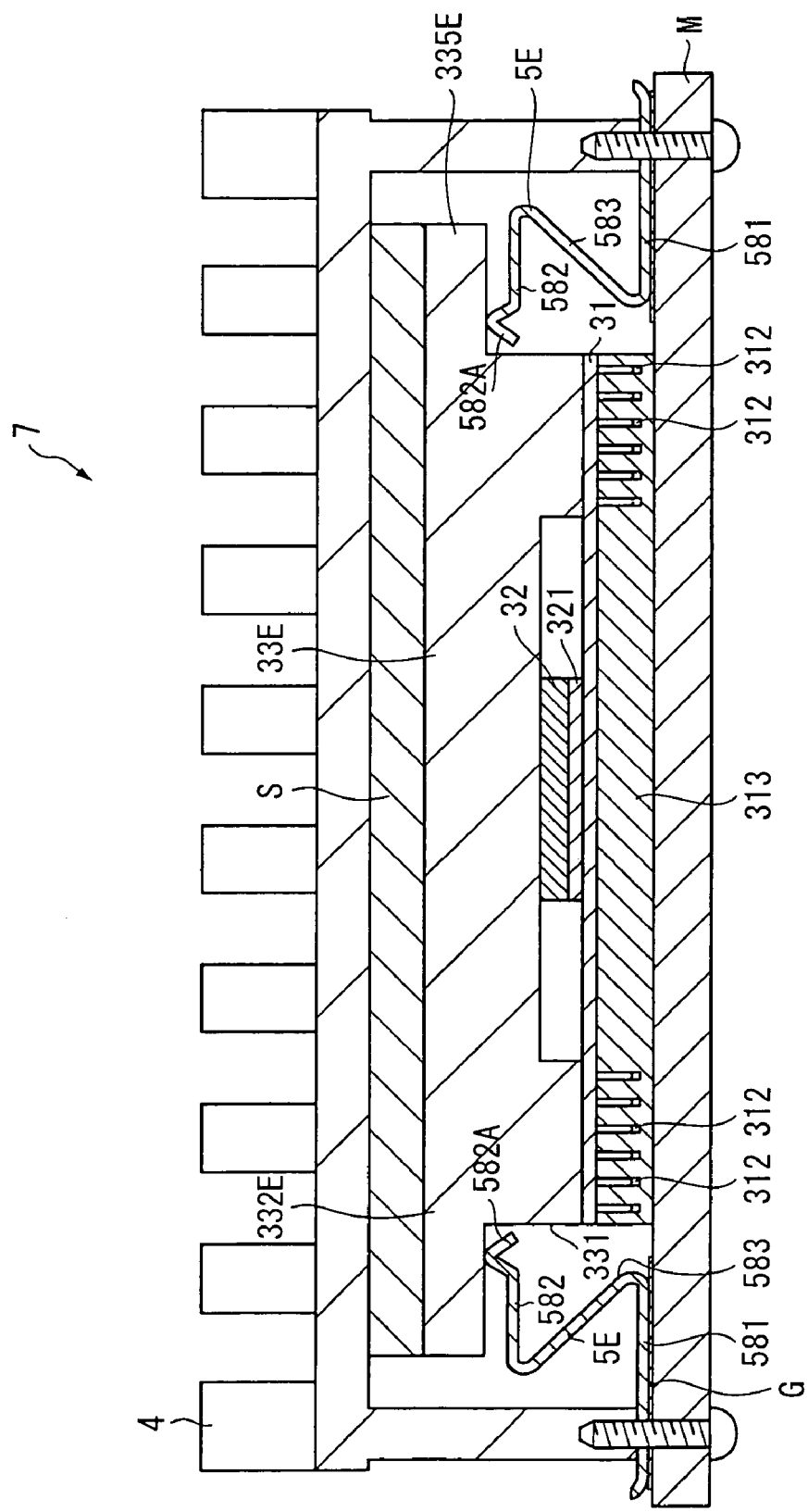
FIG. 7 shows a cross-sectional view of another alternative configuration of a CPU.

In the foregoing embodiments, the CPU 3 is of the BGA configuration, in which the bottom surface of the CPU circuit board 31 has the solder balls 311 attached thereto. On the other hand, other configurations may be employed, for example, there may be employed a CPU 7 that has plural pins 312 projecting from the bottom surface of the CPU circuit board 31, and the plural pins 312 are set in a socket 313 mounted on the mother board M, as shown in FIG. 7.

In this case, since the plural pins 312 set in the socket 313 are hard to pull out, an electromagnetic radiation suppressing member 5E that induces force pressing up a heat-diffusing board 33E may be employed. That is, a top member 332E of the heat-diffusing board 33E has its outside dimension made larger than that of the CPU circuit board 31 such that the top member 332E protrudes over the side member 331 of the heat-diffusing board 33E, and an electromagnetic radiation suppressing member 5E, which has its cross section made Z-shaped, is arranged between thus formed protruding part 335E and the ground patterns G formed on the mother board M to be in contact with them. Specifically, the electromagnetic radiation suppressing member 5E has circuit board abutments 581 that abut on the ground patterns G formed on the mother board M and are fixed to the mother board M, cover member abutments 582 abutting on the top member 332E of the heat-diffusing board 33E, and link sections 583 for linking the circuit board abutments 581 and the cover member abutments 582. The cover member abutments 582 have projections 582A abutting on the protruding part 335E of the top member 332E of the heat-diffusing board 33E. So, the heat-diffusing board 33E and the ground patterns G formed on the mother board M are connected by the electromagnetic radiation suppressing member 5E.

Furthermore, in the foregoing embodiments, the circuit board abutments 52 of the electromagnetic radiation suppressing members 5A, 5B and 5C directly abut on the ground patterns G, and electromagnetic waves transmitted to the electromagnetic radiation suppressing members 5A, 5B and 5C are directly transmitted to the ground patterns G. On the other hand, electromagnetic waves may be indirectly transmitted to the ground patterns G. For example, in case the heat sink 4 abuts on the ground patterns G, electromagnetic waves can be transmitted to the ground patterns G through the heat sink 4 by making the electromagnetic radiation suppressing member abut on the heat sink 4.

Furthermore, the cover member abutments 512 of the electromagnetic radiation suppressing members 5A, 5B and 5C, which directly abut on the heat-diffusing boards 33A, 33C in the foregoing embodiments, may indirectly abut on them. For example, the cover member abutments may abut on the heat-diffusing board through members having electrical conductivity.

In the foregoing embodiments, the CPU 3 is employed as an information processor having an integrated circuit element and a cover member, on the other hand, a chip set, a video chip, etc. may be employed instead of the CPU 3.

In the foregoing embodiments, the personal computer 1 is employed as an electronic device, on the other hand, an entertainment device, a portable electronic device such as a mobile phone, a home electric appliance such as a refrigerator or a washing machine, etc. may be employed instead of the personal computer 1.

In the first and the third embodiments, the circuit board abutments 52 are arranged at the four corners of the frames 51, 56 of the electromagnetic radiation suppressing members 5A, 5C. On the other hand, the circuit board abutments may be arranged at substantially the midpoints along the longitudinal direction of respective sides of the frames 51, 56.

In the first and the second embodiments, depressions 332A are formed at the four corners of the heat-diffusing board 33A, and the cover member abutments 512 of the electromagnetic radiation suppressing members 5A, 5B are fixed to the depressions 332A. On the other hand, the depressions may be formed at substantially the midpoints along the longitudinal direction of respective sides of the heat-diffusing board 33A. Specifically, the depressions 332A may be formed at substantially the midpoints along the longitudinal direction of respective sides of the heat-diffusing board 33A, and the electromagnetic radiation suppressing member 5B is arranged at the depressions 332A, as shown in FIG. 8.

In the first and the second embodiments, the heat-releasing member abutments 53 abutting on the heat sink 4 of the electromagnetic radiation suppressing members 5A, 5B have their parts abutting on the heat sink 4 bent outward. On the other hand, the heat-releasing member abutments 53 do not necessarily have to be bent. Even in this case, electromagnetic waves can be transmitted to the mother board M through the electromagnetic radiation suppressing members 5A, 5B so log as the heat-releasing member abutments 53 abut on the heat sink 4.

The heat-releasing member abutments 53 do not necessarily have to be formed. Even in this case, electromagnetic waves transmitted to the heat sink 4 can be transmitted to the mother board M through the fixing posts 43 of the heat sink 4 alone.

What is claimed is:

1. An electronic device that includes an information processor having an integrated circuit element for processing input information and a cover member having thermal conductivity and electrical conductivity that covers the integrated circuit element, and a circuit board for controlling input and output of information that has the information processor mounted thereon,
    wherein the electronic device comprises an electroconductive connector electrically connecting ground patterns formed on the circuit board and the cover member,
    wherein the electroconductive connector has an electroconductive connecting member abutting on the ground patterns and on the cover member and the electroconductive connecting member has a frame that encloses the sides of the cover member and has cover member abutments abutting on the cover member, and circuit board abutments that project outward from the frame and abut on the ground patterns formed on the circuit board.

2. The electronic device as set forth in claim 1, wherein the circuit board abutments abut on at least ground patterns of low impedance among the ground patterns arranged at the periphery of the position for mounting the information processor.

3. The electronic device as set forth in claim 1, wherein the cover member has depressions at which the cover member abutments of the electroconductive connecting member are arranged.

4. An electronic device that includes an information processor having an integrated circuit element for processing input information and a cover member having thermal conductivity and electrical conductivity that covers the integrated circuit element, and a circuit board for controlling input and output of information that has the information processor mounted thereon,
    wherein the electronic device comprises an electroconductive connector electrically connecting ground patterns formed on the circuit board and the cover member,
    wherein the electroconductive connector has an electroconductive connecting member abutting on the ground patterns and on the cover member and the electroconductive connecting member has at least one connection piece that has a circuit board abutment abutting on the ground patterns formed on the circuit board, a cover member abutment abutting on the cover member, and a link section for linking the circuit board abutment and the cover member abutment.

5. The electronic device as set forth in claim 4, wherein the cover member has depressions at which the cover member abutments of the electroconductive connecting member are arranged.

6. The electronic device as set forth in claim 4, wherein the circuit board abutments abut on at least ground patterns of low impedance among the ground patterns arranged at the periphery of the position for mounting the information processor.

7. An electronic device that includes an information processor having an integrated circuit element for processing input information and a cover member having thermal conductivity and electrical conductivity that covers the integrated circuit element, and a circuit board for controlling input and output of information that has the information processor mounted thereon,
    wherein the electronic device comprises an electroconductive connector electrically connecting ground patterns formed on the circuit board and the cover member,
    wherein, on the cover member, a heat-releasing member having electrical conductivity and thermal conductivity is arranged, and
    wherein the electroconductive connector has heat-releasing member abutments abutting on the heat-releasing member.

8. An information processor that is provided with an integrated circuit element for processing input information and a cover member having thermal conductivity and electrical conductivity that covers the integrated circuit element, the information processor being mounted on a circuit board,
    wherein the information processor comprises an electroconductive connector electrically connecting ground patterns formed on the circuit board and the cover,
    wherein the electroconductive connector has an electroconductive connecting member abutting on the ground patterns and on the cover member, and
    wherein the electroconductive connecting member has a frame that encloses the sides of the cover member and has cover member abutments abutting on the cover member, and circuit board abutments that project outward from the frame and abut on the ground patterns formed on the circuit board.

9. An information processor that is provided with an integrated circuit element for processing input information and a cover member having thermal conductivity and electrical conductivity that covers the integrated circuit element, the information processor being mounted on a circuit board,
    wherein the information processor comprises an electroconductive connector electrically connecting ground patterns formed on the circuit board and the cover,
    wherein the electroconductive connector has an electroconductive connecting member abutting on the ground patterns and on the cover member, and
    wherein the electroconductive connecting member has at least one connection piece that has a circuit board abutment abutting on the ground patterns formed on the circuit board, a cover member abutment abutting on the cover member, and a link section for linking the circuit board abutment and the cover member abutment.

10. An electroconductive connector for an information processor that has an integrated circuit element for processing input information and a cover member having thermal conductivity and electrical conductivity that covers the integrated circuit element, the information processor being mounted on a circuit board, the electroconductive connector abutting on ground patterns formed on the circuit board and on the cover member and electrically connecting the ground patterns and the cover member, said electroconductive con nector comprising: a frame that encloses the sides of the cover member and has cover member abutments abutting on the cover member; and circuit board abutments that project outward from the frame and abut on the ground patterns formed on the circuit board.

* * * * *